(12) United States Patent
Hutchison et al.

(10) Patent No.: US 11,335,846 B2
(45) Date of Patent: May 17, 2022

(54) MOLECULARLY DOPED PIEZOELECTRIC FOAMS

(71) Applicant: University of Pittsburgh—Of the Commonwealth System of Higher Education, Pittsburgh, PA (US)

(72) Inventors: Geoffrey R. Hutchison, Pittsburgh, PA (US); Michael James Moody, Pittsburgh, PA (US)

(73) Assignee: University of Pittsburgh—Of the Commonwealth System of Higher Education, Pittsburgh, PA (US)

( * ) Notice: Subject to any disclaimer, the term of this patent is extended or adjusted under 35 U.S.C. 154(b) by 960 days.

(21) Appl. No.: 16/074,730

(22) PCT Filed: Jan. 30, 2017

(86) PCT No.: PCT/US2017/015630
§ 371 (c)(1),
(2) Date: Aug. 1, 2018

(87) PCT Pub. No.: WO2017/136277
PCT Pub. Date: Aug. 10, 2017

(65) Prior Publication Data
US 2019/0036005 A1    Jan. 31, 2019

Related U.S. Application Data

(60) Provisional application No. 62/291,385, filed on Feb. 4, 2016.

(51) Int. Cl.
*H01L 41/193*    (2006.01)
*H01L 41/08*    (2006.01)
(Continued)

(52) U.S. Cl.
CPC .............. *H01L 41/193* (2013.01); *A43B 3/34* (2022.01); *A43B 17/003* (2013.01); *A43B 17/14* (2013.01);
(Continued)

(58) Field of Classification Search
CPC ... H01L 41/193; H01L 41/08; H01L 41/1132; H01L 41/257; H01L 41/45; C08J 9/00;
(Continued)

(56) References Cited

U.S. PATENT DOCUMENTS 4,985,179 A    1/1991   Seo et al.
5,028,355 A    7/1991   Cope et al.
(Continued)

OTHER PUBLICATIONS

ChemSrc website, properties of Poly-gamma-benzyl-L-glutamate and Poly-gamma-methyl-L-glutamate, https://www.chemsrc.com/en/cas/25086-16-2_260411.html and https://www.chemsrc.com/en/cas/25014-27-1_838050.html, printed Dec. 17, 2021, 7 pages. (Year: 2021).*

(Continued)

*Primary Examiner* — Matthew E. Hoban
*Assistant Examiner* — Lynne Edmondson
(74) *Attorney, Agent, or Firm* — Klarquist Sparkman, LLP

(57) ABSTRACT

A material that includes a polymer foam and at least one polar dopant molecule included in the polymer foam, wherein the material is a piezoelectric.

32 Claims, 4 Drawing Sheets

(51) Int. Cl.
*H01L 41/257* (2013.01)
*H01L 41/45* (2013.01)
*C08J 9/00* (2006.01)
*C08K 5/01* (2006.01)
*C08K 5/32* (2006.01)
*H01B 1/12* (2006.01)
*A43B 3/34* (2022.01)
*A43B 17/00* (2006.01)
*A43B 17/14* (2006.01)
*C08G 18/48* (2006.01)
*C08G 18/76* (2006.01)
*C08K 5/09* (2006.01)
*H01L 41/113* (2006.01)

(52) U.S. Cl.
CPC ..... *C08G 18/4829* (2013.01); *C08G 18/7671* (2013.01); *C08J 9/00* (2013.01); *C08J 9/0014* (2013.01); *C08J 9/0023* (2013.01); *C08J 9/0028* (2013.01); *C08K 5/01* (2013.01); *C08K 5/09* (2013.01); *C08K 5/32* (2013.01); *H01B 1/12* (2013.01); *H01L 41/08* (2013.01); *H01L 41/257* (2013.01); *H01L 41/45* (2013.01); *C08G 2110/0016* (2021.01); *C08G 2410/00* (2013.01); *C08J 2205/08* (2013.01); *C08J 2375/08* (2013.01); *C08K 2201/001* (2013.01); *H01L 41/1132* (2013.01)

(58) Field of Classification Search
CPC ...... C08J 9/0014; C08J 9/0023; C08J 9/0028; C08J 2205/08; C08J 2375/08; C08G 18/4829; C08G 18/7671; C08G 2101/0016; C08G 2410/00; C08K 5/01; C08K 5/09; C08K 5/32; C08K 2201/001; A43B 17/003; A43B 17/14; A43B 3/0005; H01B 1/12
See application file for complete search history.

(56) References Cited

U.S. PATENT DOCUMENTS

| | | | |
|---|---|---|---|
| 6,376,968 | B1 | 4/2002 | Taylor et al. |
| 6,960,865 | B1 | 11/2005 | Balizer |
| 9,985,197 | B2 | 5/2018 | Hutchison et al. |
| 2010/0288181 | A1 | 11/2010 | Ersoy et al. |
| 2014/0117272 | A1* | 5/2014 | Yu .......................... H01L 41/183 252/62.9 R |
| 2014/0145365 | A1* | 5/2014 | Omenetto ............... H01L 21/02 264/104 |
| 2014/0375172 | A1 | 12/2014 | Hutchison et al. |
| 2015/0274915 | A1 | 10/2015 | Shankar et al. |

OTHER PUBLICATIONS

Hutchison, "Novel High-Activity Organic Piezoelectric Materials," AFSOR Final Performance Report, Aug. 15, 2015.
International Search Report and Written Opinion issued for International Application No. PCT/US2017/015630 dated Apr. 6, 2017.

* cited by examiner

MOLECULARLY DOPED PIEZOELECTRIC FOAMS

CROSS REFERENCE TO RELATED APPLICATIONS

This application is the U.S. National Stage of International Application No. PCT/US2017/015630, filed Jan. 30, 2017, which was published in English under PCT Article 21(2), which in turn claims the benefit of U.S. Provisional Application No. 62/291,385, filed on Feb. 4, 2016, which is herein incorporated by reference in its entirety.

ACKNOWLEDGMENT OF GOVERNMENT SUPPORT

This invention was made with government support under grant FA9550-12-1-0228 awarded by the Air Force Office of Scientific Research, U.S. Air Force. The government has certain rights in the invention.

BACKGROUND

Piezoelectric materials have many technological applications, from actuators to sensors to energy harvesting. They are especially attractive for interconverting electrical and mechanical energy in compact devices and microelectromechanical systems (MEMS) because of mechanical simplicity. Commercial applications tend to use ceramics or intrinsically-piezoelectric polymers, but several other classes of materials are known, such as ceramic and polymer composites and spacecharge electrets. Fundamental research into single molecule piezomaterials has predicted good performance, although none has yet been demonstrated beyond the molecular monolayer scale. While each of these materials has strengths, most have low flexibility.

Generally, the largest possible piezocoefficient (e.g., any of the $d_{ij}$ tensor elements) is desired, since this yields the greatest generated charge per applied force (or greatest sensitivity). Ceramic materials are widely used and are among the best in this regard, with piezocoefficients routinely above 200 pC N-1 for perovskites such as lead zirconium titanate (PZT). Mechanical properties are also important for electromechanical devices, however, and ceramic devices are limited in terms of flexibility. One of the motivations for using polymers is the larger strains to which they can be subjected. Processing concerns are also a factor, as polymers can be formed and poled more easily and at lower temperatures. The tradeoff with current polymers is piezoresponse, which is at best an order of magnitude lower than PZT (i.e., for polyvinylidene difluoride (PVDF) 20-30 pC N-1). Composites of polymers with BaTiO3 or zinc oxide nanowires have been shown to have greater piezoresponse than pure polymers (i.e., ~40 pC N-1) while still maintaining properties such as extreme flexibility or amenability to 3D printing. Composites are promising, but have still failed to match PZT in terms of piezoresponse.

SUMMARY

Disclosed herein is a material comprising:
a polymer foam; and
at least one polar dopant molecule included in the polymer foam;
wherein the material is a piezoelectric.

Also disclosed herein is a material comprising:
a polymer foam matrix; and
at least one polar dopant molecule dispersed within the polymer foam matrix;
wherein the polar dopant molecule is axially aligned with electric dipoles in the direction of poling.

Further disclosed herein is a method for making a material comprising:
introducing a polar dopant molecule into a polymer foam precursor to form an admixture; and
curing and electrically poling the admixture to form a piezoelectric polymeric foam material.

The foregoing will become more apparent from the following detailed description, which proceeds with reference to the accompanying figures.

DETAILED DESCRIPTION

Figure 1A:
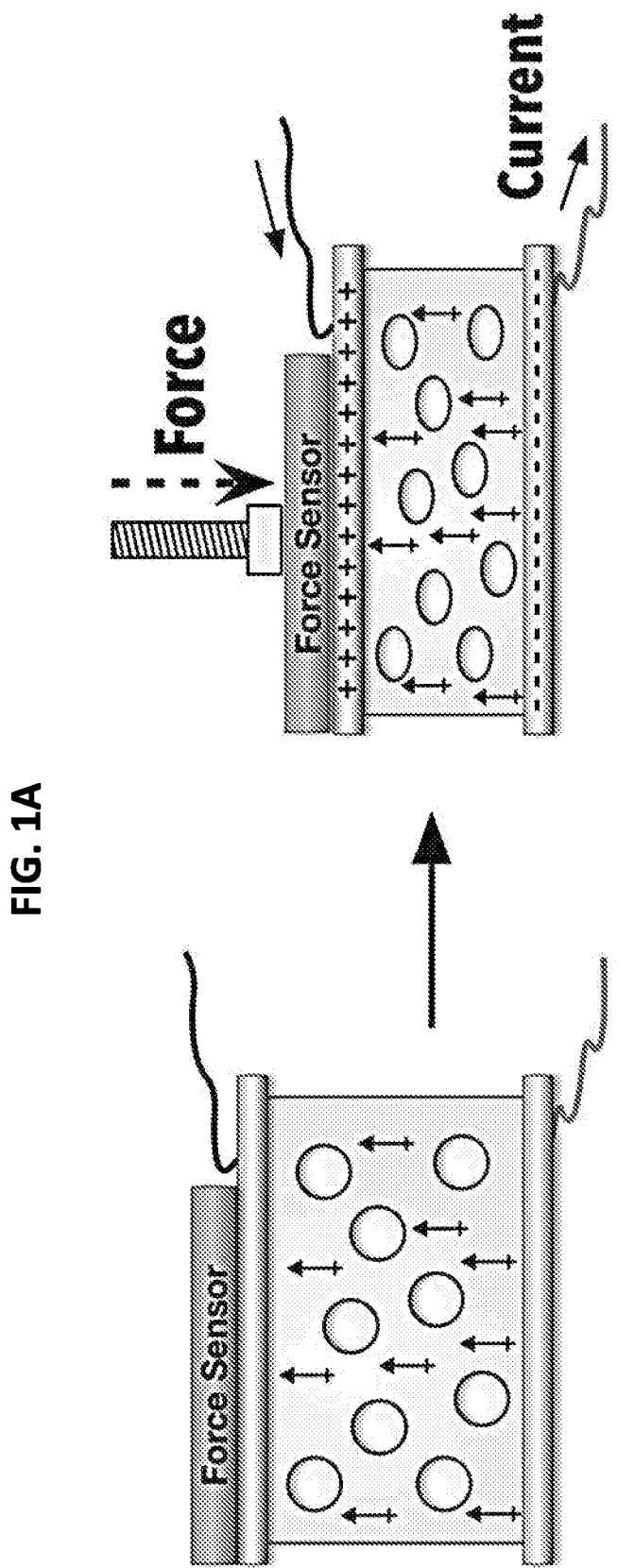
FIG. 1A. Schematic of material disclosed herein, in which compression of foam causes an increase in dipole moment density due to fixed guest dipoles, inducing a surface charge and current flow.

Disclosed herein are polymer foams doped with oriented polar molecules that can serve as flexible piezoelectric materials with large volume changes and polarization changes under applied force. The piezocoefficient $d_{ij}$ piezoelectric tensor element (or simply piezocoefficient, typically in pC N$^{-1}$) is directly proportional to the dipole moment and the concentration of the dopant and inversely proportional to the Young's modulus of the polymer foam matrix. Disclosed herein are piezoelectric polymer foams based, for example, on a polyurethane foam doped with polar small molecules and electrode-poled while curing at room temperature.

The resulting piezoelectric performance as measured by the $d_{33}$ piezocoefficient in pC/N is at least an order of magnitude greater than conventional polymer piezomaterials and on par with the leading inorganic ceramics (e.g., lead zirconium titanate). The polymer matrix and polar guest molecule can be selected independently to tune mechanical and electrical response and create active materials with a wide range properties.

In certain embodiments, the polymer foams preferably are flexible foams, having a low degree of crosslinking and low resistance to deformation under pressure.

The polymer foam may be made from a non-conductive polymeric material that is sufficiently compressible. The foam has internal voids that compress under loaded force. In certain embodiments, the foam has a low bulk modulus. For example, the foam may have a bulk modulus of less than 100 MPa, more particularly less than 10 MPa, and most particularly less than 1 MPa.

Illustrative polymers include elastomers such as polyurethane, polydimethylsiloxane (PDMS), polymethylmethacrylate (PMMA), elastomers such as chloroprene, neoprene, nitrile rubber, butyl rubber, halogenated butyl rubber, polyetherblock amide, or a mixture thereof. In certain embodiments, the polymer foam is a closed-cell foam. In certain embodiments, the foam has a porosity of 50% to 99.9%, more particularly 90% to 99%. In certain embodiments, the foam has an average pore size of 50 nm to 5 mm, more particularly 20 μm to 2 mm. In certain embodiments, the polymer is not an intrinsically piezoelectric polymer such as polyvinylidene fluoride (PVDF) or polyimide.

The polar dopant molecule may be any small, stable molecule with a large permanent molecular dipole moment and sufficient solubility in the polymer foam precursor. For example, the permanent molecular dipole moment of the dopant molecule may be at least 0.5 Debye, more particularly at least 2 D, and most particularly at least 4D. Illustrative dopant molecules include substituted benzenes, small polycyclic aromatic hydrocarbons, small biological molecules, or a mixture thereof. Illustrative substituted benzenes include unsubstituted or substituted nitroaniline, and unsubstituted or substituted benzoic acid. Illustrative substituted nitroanilines include halogenated nitroanilines such as 2-chloro-4-nitroaniline (CNA) and 2-methyl-4-nitroaniline (MNA). Illustrative polycyclic aromatic hydrocarbons include substituted naphthalene such as 2-bromo-4-methoxynapthalene. Illustrative small biological molecules include guanine, other amino acids, and peptides. In certain embodiments, the polar dopant molecule has a molecular weight of 50 Da to 5000 Da, preferably 100 Da to 1000 Da The dopant molecules in the polymer foam are axially aligned parallel to the intended direction of compression, thus resulting in bulk homogeneous polar order for the piezoelectric foams. In certain embodiments, the piezoelectric foams may have a $d_{33}$ piezocoefficient of at least 10 pC/N, more particularly at least 30 pC/N, and most particularly at least 200 pC/N.

The amount of polar dopant molecule loaded into the foam may range from the maximum solubility of the dopant molecule in the polymer foam precursor to a lower amount that is sufficient to provide the desired piezocoefficient. In certain embodiments, the concentration of dopant may range from 10 mM to 2 M, more particularly from 0.1 M to 2 M, and most particularly from 0.5 M to 2 M, based on the total volume of foam precursors.

The materials disclosed herein may be made by introducing the dopant molecule into a polymer foam precursor. For example, the dopant molecule may be mixed into a liquid polymer foam precursor. In certain embodiments, the polymer foam is made from two- or multi-part systems and the dopant molecule may be introduced into one or more of the precursor parts.

The dopant molecule/polymer precursor mixture is cured and electrically poled to form the piezoelectric polymeric foam material. The duration of the curing and poling may be the same or may be different. In certain embodiments, there is an overlap at some stage so that there is simultaneous curing and poling. The minimum curing time may be 0.5, 5, or 30 minutes and the maximum curing time may be 2 hours, 1 day, or one week. The minimum poling time may be 0.5, 5, or 30 minutes and the maximum poling time may be 2 hours, one day, or one week. The minimum applied field during poling may be 10 V/mm, 100 V/mm, or 500 V/mm and the maximum applied field may be 3 kV/mm, 5 kV/mm, or 10 kV/mm. The dipole moment of the individual dopant molecules, and thus the resulting piezoelectric axis, are parallel to the applied field.

The curing may be effected by any mechanism. For example, curing may occur upon reacting together two polymer precursors such as two reactants (e.g, polyol and isocyanate for polyurethane). The curing may be accomplished via heating, an initiator and/or simply mixing together the reactants.

In certain embodiments, the dopant/polymer precursor mixing, the curing and the poling may be performed at room temperature. In certain embodiments, at least one of the dopant/polymer precursor mixing, the curing and/or the poling may be performed at a temperature higher than room temperature.

The resulting product is a piezoelectric foam that includes the dopant molecules dispersed, preferably homogeneously dispersed, within the foam matrix.

In a polyurethane foam embodiment, the polyurethane foams can be produced by the reaction product of a polyol, or a mixture of polyols, having primary and/or secondary hydroxyl or amine groups; an isocyanate, a polyisocyanate, or a mixture thereof; and a foaming agent to allow for the formation of polyurethane foams. Other reactants and additives can include, but are not limited to, catalysts, cross-linkers, chain extenders, surfactants and/or stabilizers, among other additives. In certain embodiments the dopant molecule may be mixed with the polyol component.

The polyols generally have at least two hydrogen atoms that are reactive towards isocyanates and can have a nominal functionality ranging from 2 to 10, a number average molecular weight of 100 to 10,000 (e.g., such as 200 to 700), and an average hydroxyl number ranging from 20 to 800 mg KOH/g. Useful polyols include polyether polyols, polyester polyols, polyhydroxy-terminated acetal resins, polyetheresters, polycarbonates, polyesteramides, polyalkylene carbonate-based polyols, and hydroxy-terminated amines and polyamines.

Examples of suitable isocyantes and/or polyisocyanates include aliphatic, cycloaliphatic, arylaliphatic and/or aromatic isocyanates.

Aliphatic, cycloaliphatic, arylaliphatic, aromatic and aromatic isocyanates can have the general formula $Q(NCO)_n$, in which n can be from 2 to 4 or from 2 to 3, and Q can be an aliphatic hydrocarbon radical having from 2 to 18 or from 6 to 10, carbon atoms, a cycloaliphatic hydrocarbon radical having from 4 to 15 or from 5 to 10, carbon atoms, an aromatic hydrocarbon radical having from 6 to 15, or from 6 to 13, carbon atoms, or an aralipathic hydrocarbon radical having from 8 to 15, or 8 to 13, carbon atoms.

Examples of suitable aromatic isocyanates include the 4,4'-, 2,4' and 2,2'-isomers of diphenylmethane diisocyanate (MDI), blends thereof and polymeric and monomeric MDI blends, toluene-2,4- and 2,6-diisocyanates (TDI), m- and p-phenylenediisocyanate, chlorophenylene-2,4-diisocyanate, diphenylene-4,4'-diisocyanate, 4,4'-diisocyanate-3,3'-dimethyldiphenyl, 3-methyldiphenyl-methane-4,4'-diisocyanate and diphenyletherdiisocyanate and 2,4,6-triisocyanatotoluene and 2,4,4'-triisocyanatodiphenylether. An example of a toluene diisocyanate includes, but is not limited to, VORANATE T-80 from The Dow Chemical Company.

Mixtures of isocyanates may be used, such as the commercially available mixtures of 2,4- and 2,6-isomers of toluene diisocyanates. A crude polyisocyanate may also be used in the practice of this disclosure, such as crude toluene diisocyanate obtained by the phosgenation of a mixture of toluene diamine or the crude diphenylmethane diisocyanate obtained by the phosgenation of crude methylene diphenylamine TDI/MDI blends may also be used.

Examples of aliphatic polyisocyanates include ethylene diisocyanate, 1,6-hexamethylene diisocyanate, isophorone diisocyanate, cyclohexane 1,4-diisocyanate, 4,4'-dicyclohexylmethane diisocyanate, 1,3-bis(isocyanatomethyl)cyclohexane, 1,4-bis(isocyanatomethyl)cyclohexane, saturated analogues of the mentioned aromatic isocyanates, and mixtures thereof.

For the production of flexible foams, the polyisocyanates may often be the toluene-2,4- and 2,6-diisocyanates or MDI or combinations of TDI/MDI or prepolymers made therefrom.

Examples of foaming agents include those substances known for production of polyurethane foams. Examples include water, gases (e.g., carbon dioxide), volatile organic compounds (e.g., n-pentane, isopentane, cyclopentane) and halogen-containing alkanes (e.g., trichloromethane, methylene chloride, chlorofluoroalkanes). A mixture of a plurality of foaming agents can also be used.

The piezoelectric foam disclosed herein may be used in a variety of applications.

Piezoelectric materials can be used for energy harvesting, and soft materials such as foams are especially well-matched for unobtrusive coupling to human movements. For example, electrical current from piezoelectric shoe insoles could be used to charge cell phones, self-integrated force, or vibration sensors, or other personal electronics. Distributed sensors could be powered by piezoelectric energy harvesting if located in environments with ambient mechanical vibration. Implantable devices can also be powered piezoelectrically including pacemakers.

Additionally, piezoelectric materials can be used as force, vibration, or motion sensors. Foams can be easily processed into a variety of geometries, and applied force or mechanical distortion of piezomaterials generates current.

Piezoelectric materials are also presently used as actuators. Foam piezomaterials with large piezocoefficients such as disclosed here could replace current materials for microscale positioning, but may also be useful for systems such as active dampening, where dynamic, piezoelectrically-applied force is used to reduce vibrations.

EXAMPLES

Testing of several dopants and poling conditions showed foams in which electrical current was associated with the application of force such that the integrated current signal (charge) was linearly proportional to applied force. The slope of this relation is thus the direct effect piezocoefficient. Differences between various samples and unpoled or undoped controls confirmed material piezoresponse as opposed to measurement-related noise.

Figure 1B:
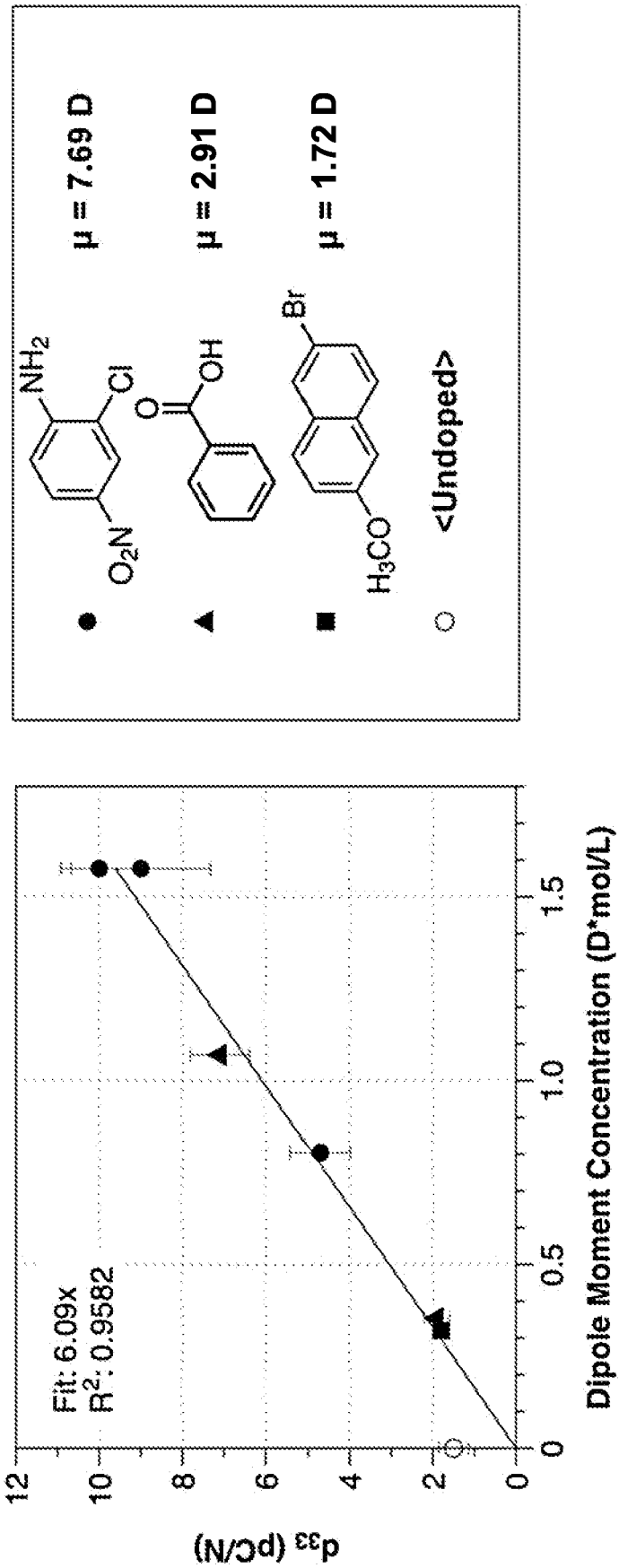
FIG. 1B. Piezocoefficient as a function of the product of dopant dipole moment and concentration when poled at 40 V mm$^{-1}$, for 2-chloro-4-nitroaniline, benzoic acid, and 2-bromo-6-methoxynapthalene. Dipole moments were calculated with MOPAC2012 using PM6.

Samples with varying concentrations of several dopants poled at 40 V mm$^{-1}$ showed varying piezocoefficients, plotted in FIG. 1B as a function of the product of dopant concentration and molecular dipole moment (the theoretical maximum polarization).

The piezocoefficient is proportional to the product of the concentration and the molecular dipole moment of the dopants. The fact that the response depends on the dipole moment but not other chemical or structural factors is significant. Pure benzoic acid and CNA crystals are not piezoelectric because they form centrosymmetric lattices, yet their single-molecule polarity can be used by incorporating them as dispersed guest molecules in a polymer matrix to create long-range polar order.

Figure 2B:
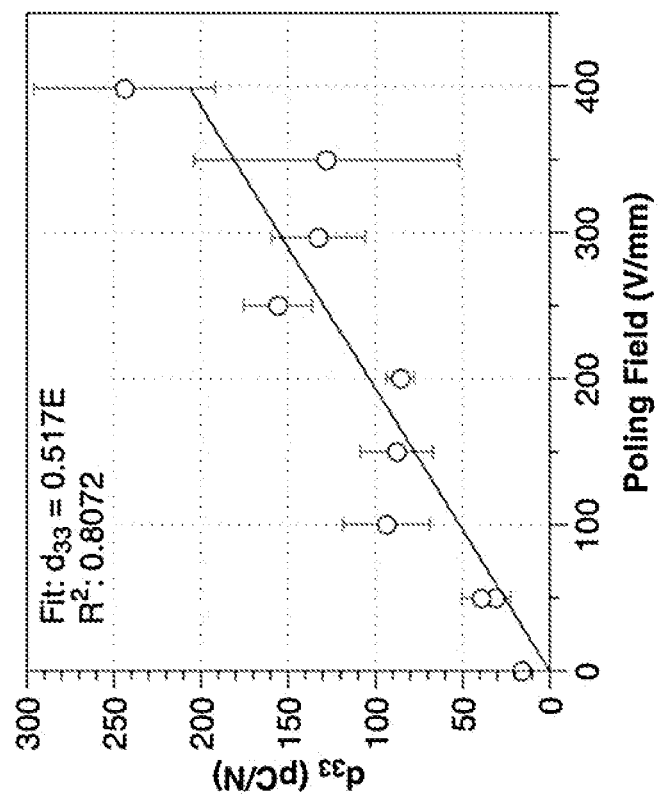
FIG. 2B. Piezocoefficient as a function of poling field for samples doped with 0.2 M 2-chloro-4-nitroaniline.

The piezocoefficient was observed to increase with poling field, as plotted in FIG. 2B. A response of 244±52 pC N$^{-1}$ was measured at the maximum field of 400 V mm$^{-1}$. This is now 44% of the calculated piezocoefficient for complete poling. Given that the calculated value uses an estimated dielectric constant and mechanical properties taken from specifications rather than measured in this study, this percentage has considerable uncertainty, but it does suggest appreciable poling.

Another poling-dependent property of these materials is stability. Samples poled at low fields have responses which decay on the order of tens of minutes. Samples poled at fields of 150 V mm$^{-1}$ or greater decrease by less than 20% over several days (over four days in some cases) and then decrease by over 80% in less than two days. In light of the significant poling fractions at these fields, the additional stability at higher poling fractions may be conferred by a cooperative effect, and this stabilization may be lost once the poling fraction decreases below some threshold. At a concentration of 0.2 M, the average separation between guest molecules is 2.0 nm. This is slightly over three molecule lengths in the case of CNA, so dopant-dopant interactions are likely.

Figure 3A:
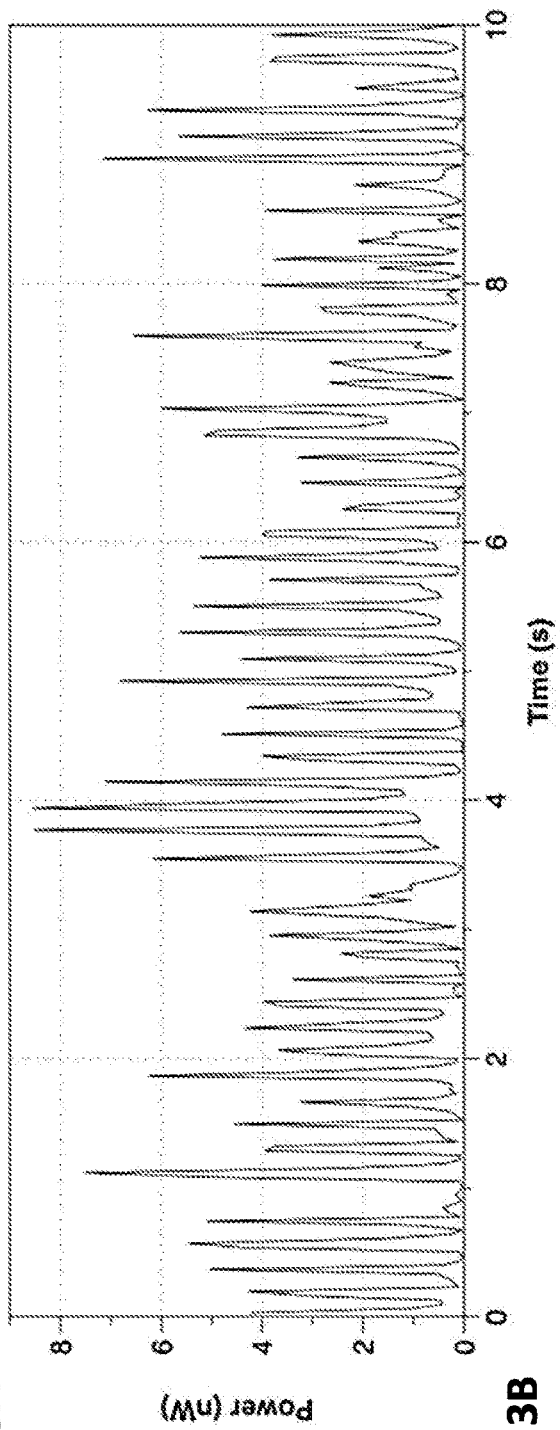
FIG. 3A. Power dissipated in the load as a function of time for a sample subjected to light finger taps, with an average power of 1.5 nW.
Figure 3B:
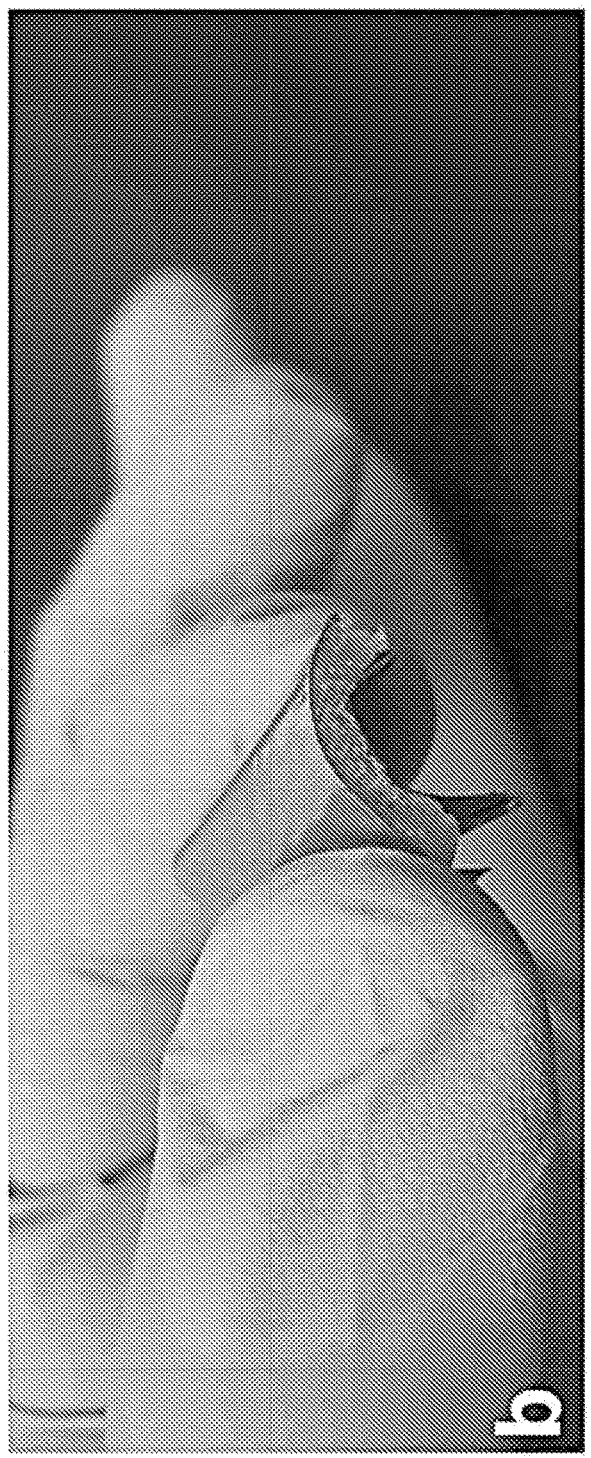
FIG. 3B. The piezomaterial is extremely flexible and flexional motion also generates electric charge.

As a further demonstration of the utility of the material disclosed herein, measurements of power output were made. A sample with a piezocoefficient of 111.9 pC N$^{-1}$ had a voltage output of 307 mV N$^{-1}$. At a frequency of 3 Hz, this implies an impedance of 915 MΩ. This sample was connected to a load of 1 GΩ and subjected to light finger taps while current through the load and voltage across the load was measured. This yielded a typical peak current output of 5 nA, a typical peak power output of 5 nW, and an average power output of 1.5 nW. FIG. 3A shows the power as a function of time and FIG. 3B shows the device, emphasizing flexibility.

Polyurethane foams are often used as shoe insoles, so one possible use is self-powered sensors. If used in shoe inserts, this material would permit useful power output. Walking or running can produce over twice the body weight in instantaneous applied force. For a piezocoefficient of 250 pC/N, a loading of 1000 N once per second would yield an average current of 500 nA and peak currents likely above 5 μA. For an element ~15 cm$_2$ with a voltage output of 130 mV N$^{-1}$, this would mean an output power of 65 μW, or 4.3 μW/cm$^2$. This is enough to power a low-power application specific integrated circuit (8 μW) or, taking advantage of low-power sleep modes, a general purpose microcontroller with a low duty cycle. Multiple-layer devices could further increase power output and lower source impedance for ease of use with typical loads.

Experimental Section

Materials: Polytek Development Corporation PolyFoam F-3 polyurethane precursors (part A, Methylene bis(phenylisocyanate) and other isomers, and part B, polyether polyol and proprietary copolymer) were obtained from BITY Mold Supply. Benzoic acid (ACS reagent grade) was obtained from J. T. Baker. 2-bromo-6-methoxynapthalene (98%) was obtained from Acros Organics. Acetone (ACS reagent grade) was obtained from Fisher. 2-chloro-4-nitroaniline (98%) was obtained from Tokyo Chemical Industry Co. Ltd. Preparation of samples: Dopants were dissolved either in polyurethane precursor part B or in acetone. Two parts B and one part A by mass were combined, with solvent if used, and mixed by hand for 30 s. The mixture was portioned into a poling fixture consisting of two electrodes 2 cm by 2 cm with a fixed separation of 5 mm. The electrodes are used as a mold to set the thickness as well as to create the electric field. The resulting foam can also be cut to shape afterwards. Samples were cured for two hours at room temperature with an applied bias of up to 2 kV. After being removed from the poling fixture, copper tape electrodes were attached to the top and bottom surfaces of the samples.

Figure 2A:
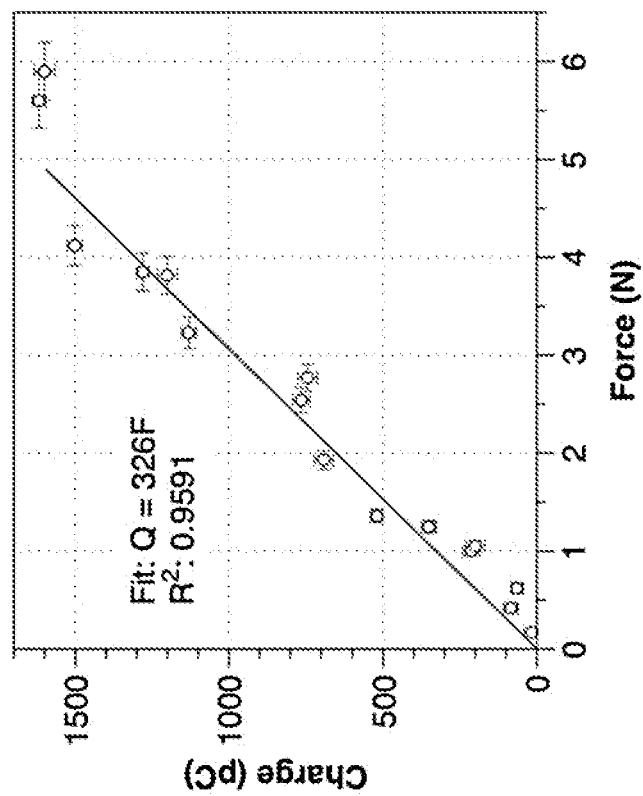
FIG. 2A. Net charge transferred as a function of applied force. The charge is a linear function of force up to a saturation point, associated with strains of over 50%.

It was also observed that increased ambient humidity had a negative influence on the piezocoefficient. During periods of ambient humidity over 40%, precursors were mixed and poled in a glove bag with nitrogen fill (RH<22%) and measured and stored in ambient conditions. Glovebag samples showed somewhat higher responses than samples prepared in dry ambient conditions but follow the same trends (cf. FIG. 2 data with glovebag samples and FIG. 1 data with ambient samples).

Measurement of $d_{33}$: Samples were placed in a screw-thread compression fixture underneath a resistive force sensor. Short-circuit current from the sample electrodes and force sensor measurements were recorded over 70 s with a Keithly 2612 sourcemeter while varying forces were applied manually with the fixture. Measured currents were integrated to determine charge, and the $d_{33}$ piezocoefficient was calculated as the regression slope of charge vs. force.

In view of the many possible embodiments to which the principles of the disclosed materials, methods and devices may be applied, it should be recognized that the illustrated embodiments are only preferred examples and should not be taken as limiting the scope of the invention.

What is claimed is:

1. A material comprising:
   a polymer foam; and
   at least one polar dopant molecule included in the polymer foam, wherein the polar dopant molecule is selected from unsubstituted nitroaniline, substituted nitroaniline, unsubstituted benzoic acid, substituted benzoic acid, or substituted naphthalene; and
   wherein the material is a piezoelectric.

2. A material comprising:
   a polymer foam matrix; and
   at least one polar dopant molecule dispersed within the polymer foam matrix, wherein the polar dopant molecule is selected from unsubstituted nitroaniline, substituted nitroaniline, unsubstituted benzoic acid, substituted benzoic acid, or substituted naphthalene; and;
   wherein the polar dopant molecule is axially aligned with electric dipoles in the direction of poling.

3. The material of claim 1, wherein the material has a bulk modulus of less than 10 MPa.

4. The material of claim 1, wherein the polymer foam is polyurethane, polydimethylsiloxane (PDMS), polymethylmethacrylate (PMMA), chloroprene, neoprene, nitrile rubber, butyl rubber, halogenated butyl rubber, or polyetherblock amide.

5. The material of claim 1, wherein the polymer foam is a polyurethane foam.

6. The material of claim 1, wherein the polar dopant molecule is a halogenated nitroaniline.

7. The material of claim 1, wherein the polar dopant molecule is a substituted naphthalene.

8. The material of claim 1, wherein the polar dopant molecule is 2-chloro-4-nitroaniline (CNA).

9. The material of claim 1, wherein the polar dopant molecule is benzoic acid.

10. The material of claim 1, wherein the polar dopant molecule has a permanent molecular dipole moment of at least 1 D.

11. The material of claim 1, wherein the material includes 0.01 to 2 M of the polar dopant molecule.

12. The material of claim 1, wherein the material has a piezocoefficient ($d_{33}$) of at least 30 pC/N.

13. A device comprising the material of claim 1.

14. A method for making a material comprising:
    introducing a polar dopant molecule into a polymer foam precursor to form an admixture, wherein the polar dopant molecule is selected from unsubstituted nitroaniline, substituted nitroaniline, unsubstituted benzoic acid, substituted benzoic acid, or substituted naphthalene; and
    curing and electrically poling the admixture to form a piezoelectric polymeric foam material.

15. The method of claim 14, wherein an electric field of at least 10 V/mm is applied during poling.

16. The method of claim 14, wherein the polymer foam is polyurethane, polydimethylsiloxane (PDMS), polymethylmethacrylate (PMMA), chloroprene, neoprene, nitrile rubber, butyl rubber, halogenated butyl rubber, or polyetherblock amide.

17. The method of claim 14, wherein the polymer foam is a polyurethane foam.

18. The method of claim 14, wherein at least a portion of the curing and at least a portion of the electrically poling both occur during the same time frame.

19. The material of claim 2, wherein the polymer foam is a polyurethane foam.

20. The material of claim 2, wherein the polar dopant molecule is a halogenated nitroaniline.

21. The material of claim 2, wherein the polar dopant molecule is a substituted naphthalene.

22. The material of claim 2, wherein the polar dopant molecule is 2-chloro-4-nitroaniline (CNA).

23. The material of claim 2, wherein the polar dopant molecule is benzoic acid.

24. The material of claim 1, wherein the material has a piezocoefficient ($d_{33}$) of at least 200 pC/N.

25. The material of claim 8, wherein the polymer foam is a polyurethane foam.

26. The material of claim 9, wherein the polymer foam is a polyurethane foam.

27. A material comprising:
    a polymer foam; and
    at least one polar dopant molecule included in the polymer foam, wherein the polar dopant molecule has a molecular weight of 50 Da to 5000 Da and is a substituted benzene or a polycyclic aromatic hydrocarbon; and
    wherein the material is a piezoelectric.

28. A material comprising:
    a polymer foam matrix; and
    at least one polar dopant molecule dispersed within the polymer foam matrix, wherein the polar dopant molecule has a molecular weight of 50 Da to 5000 Da and is a substituted benzene or a polycyclic aromatic hydrocarbon; and
    wherein the polar dopant molecule is axially aligned with electric dipoles in the direction of poling.

29. The material of claim 27, wherein the polymer foam is a polyurethane foam.

30. The material of claim 28, wherein the polymer foam is a polyurethane foam.

31. A material comprising:
a polyurethane foam; and
at least one polar dopant molecule included in the polymer foam, wherein the polar dopant molecule has a molecular weight of 50 Da to 5000 Da; and
wherein the material is a piezoelectric.

32. A material comprising:
a polyurethane foam matrix; and
at least one polar dopant molecule dispersed within the polymer foam matrix, wherein the polar dopant molecule has a molecular weight of 50 Da to 5000 Da; and
wherein the polar dopant molecule is axially aligned with electric dipoles in the direction of poling.

\* \* \* \* \*